US009361066B2

(12) United States Patent
Rooks

(10) Patent No.: US 9,361,066 B2
(45) Date of Patent: Jun. 7, 2016

(54) RANDOM NUMBER GENERATOR USING RING OSCILLATORS WITH INITIAL DELAY

(71) Applicant: THE UNITED STATES OF AMERICA AS REPRESENTED BY THE SECRETARY OF THE AIR FORCE, Washington, DC (US)

(72) Inventor: John W. Rooks, Rome, NY (US)

(73) Assignee: The United States of America as represented by the Secretary of the Air Force., Washington, DC (US)

( * ) Notice: Subject to any disclaimer, the term of this patent is extended or adjusted under 35 U.S.C. 154(b) by 190 days.

(21) Appl. No.: 14/150,870

(22) Filed: Jan. 9, 2014

(65) Prior Publication Data

US 2015/0193208 A1   Jul. 9, 2015

Related U.S. Application Data

(60) Provisional application No. 61/817,368, filed on Apr. 30, 2013.

(51) Int. Cl.
*G06F 7/58* (2006.01)
*H03K 3/84* (2006.01)
*H03K 3/03* (2006.01)

(52) U.S. Cl.
CPC *G06F 7/588* (2013.01); *H03K 3/84* (2013.01); *H03K 3/0315* (2013.01)

(58) Field of Classification Search
None
See application file for complete search history.

(56) References Cited

U.S. PATENT DOCUMENTS

| | | | | |
|---|---|---|---|---|
| 2002/0120898 A1* | 8/2002 | Chen | H03K 3/84 | 714/739 |
| 2006/0069706 A1* | 3/2006 | Lazich | G06F 7/588 | 708/251 |
| 2009/0089347 A1* | 4/2009 | Pomet | G06F 7/588 | 708/250 |
| 2011/0131263 A1* | 6/2011 | Vasyltsov | G06F 7/588 | 708/251 |
| 2012/0233233 A1* | 9/2012 | Chandra | G06F 7/588 | 708/251 |
| 2014/0201253 A1* | 7/2014 | Chu | G06F 7/588 | 708/250 |
| 2015/0106415 A1* | 4/2015 | Mei | H03K 3/84 | 708/251 |

* cited by examiner

*Primary Examiner* — Matthew Sandifer
(74) *Attorney, Agent, or Firm* — Joseph A Mancini

(57) ABSTRACT

Apparatus and method for a ring oscillator based random number generator with intentional startup delays timed for each ring to provide a uniform initial spreading of the ring oscillator transition edges. This invention adds a controlled incremental delay in the startup of each individual ring within the ring oscillator random number generator. Typically the delay units used in the ring oscillators themselves can be used to get a course delay between the start times of each ring. A subset of the rings start up with a particular course delay and different fine delays such that the transition edges of all the rings are spread out over the oscillation period. This spreading of the transition edges ensures the output of the random number generator are not a predictable sequence of ones and zeros based on a simultaneous startup of all rings at the same time.

6 Claims, 3 Drawing Sheets

RANDOM NUMBER GENERATOR USING RING OSCILLATORS WITH INITIAL DELAY

PRIORITY CLAIM UNDER 35 U.S.C. §119(e)

This patent application claims the priority benefit of the filing date of provisional application Ser. No. 61/817,368, having been filed in the United States Patent and Trademark Office on Apr. 30, 2013 and now incorporated by reference herein.

STATEMENT OF GOVERNMENT INTEREST

The invention described herein may be manufactured and used by or for the Government for governmental purposes without the payment of any royalty thereon.

BACKGROUND OF THE INVENTION

One method of generating a random number on a digital integrated circuit is to use a number of ring oscillators, (typically an odd number of digital inverters connected in a loop), with their outputs latched and those latched values having an XOR function performed on them. If the individual ring oscillators have different phases the output cannot be predicted because the capture of the current output state (0 or 1) by the latches will include capturing of some transitioning edges. The results of those that are transitioning will not be predictable due to noise. Prior art designs have relied on random circuit variations unintentionally created during manufacturing to ensure the ring oscillators have slightly different phases between each of the many ring oscillators in the design.

The individual ring oscillators in the prior art typically have circuitry to enable (or inhibit) their oscillation. There is a possibility that when they are first started the rings may be similar enough that the latching and XORing function will catch a consistent set of all zeros or all ones, or behave in a predictable manner, delivering a predictable output stream for some period of time.

OBJECTS AND SUMMARY OF THE INVENTION

It is therefore an object of the present invention to provide an apparatus and method that overcomes the prior art's limitations by intentionally staggering the startup of the ring oscillators across one (or more) of their oscillation cycles by including a delay circuit between each ring oscillator's enable signal and the next ring oscillator's enable signal. Even if each ring oscillator is very similar, their intentional offset in starting up will help ensure the bits generated are random.

DETAILED DESCRIPTION OF THE PREFERRED EMBODIMENT

Figure 1:
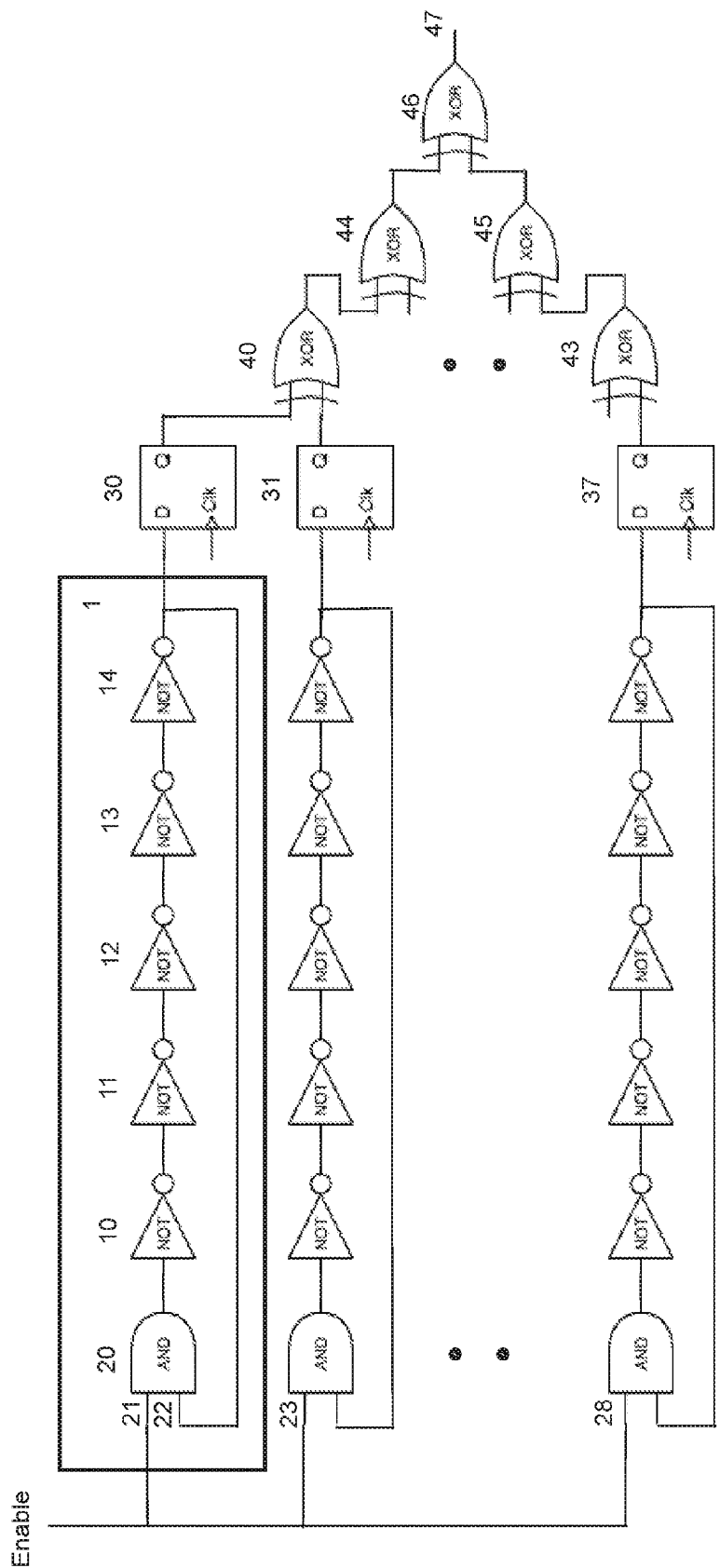
FIG. 1 is a schematic diagram representation of a prior art ring oscillator based random number generator.

Referring to FIG. 1, the key components of a prior art ring oscillator random number generator are shown. An odd number of inverters 10, 11, 12, 13, 14 shown in the top most ring oscillator, 1 are connected in a loop that includes an AND gate 20, used to enable the ring oscillator. When AND gate 20 has a "1" on input 21 the looped back ring consisting of 10 driving 11, 11 driving 12, 12 driving 13, 13 driving 14, 14 driving AND gate input 22 will oscillate. The oscillation period is twice the propagation delay time through the looped circuitry since two passes through the loop are required to return to the original value.

Still referring to FIG. 1, the output of each ring is captured by flip-flops 30, 31, through 37, which are clocked at a much slower frequency than the ring oscillator's frequency. The outputs of flip-flops 30, 31 through 37, are processed through XOR gates 40 through 46. The output 47 will be random if any one or more of the flip-flops 30, 31 through 37, are random. A major source of true randomness is generated from capturing a transitioning edge at the input to the flip-flops 30, 31 through 37.

Figure 2:
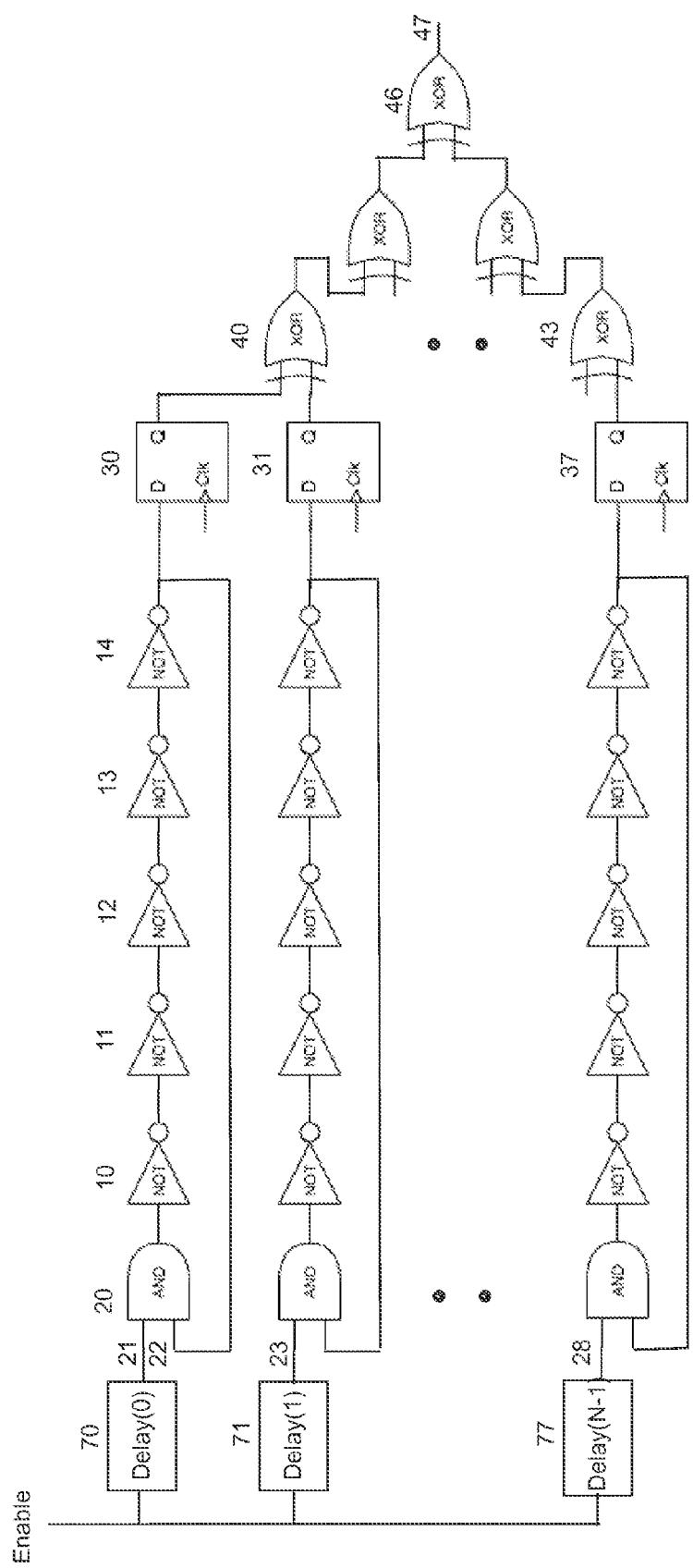
FIG. 2 is a schematic diagram representation of the present invention as part of a random number generator.

Referring to FIG. 2, the delay cells 70, 71 through 77, provide a delay that increases with ring number, in the enable signal's arrival at AND gate inputs 21, 23 through 28. By delaying the individual ring enable signals 21, 23 through 27, the startup time of the individual rings is staggered ensuring the transitioning edges are spread out over the oscillation cycle. Having equally distributed transitions helps ensure some of the values latched in flip-flops 30, 31 through 37, are random.

Figure 3:
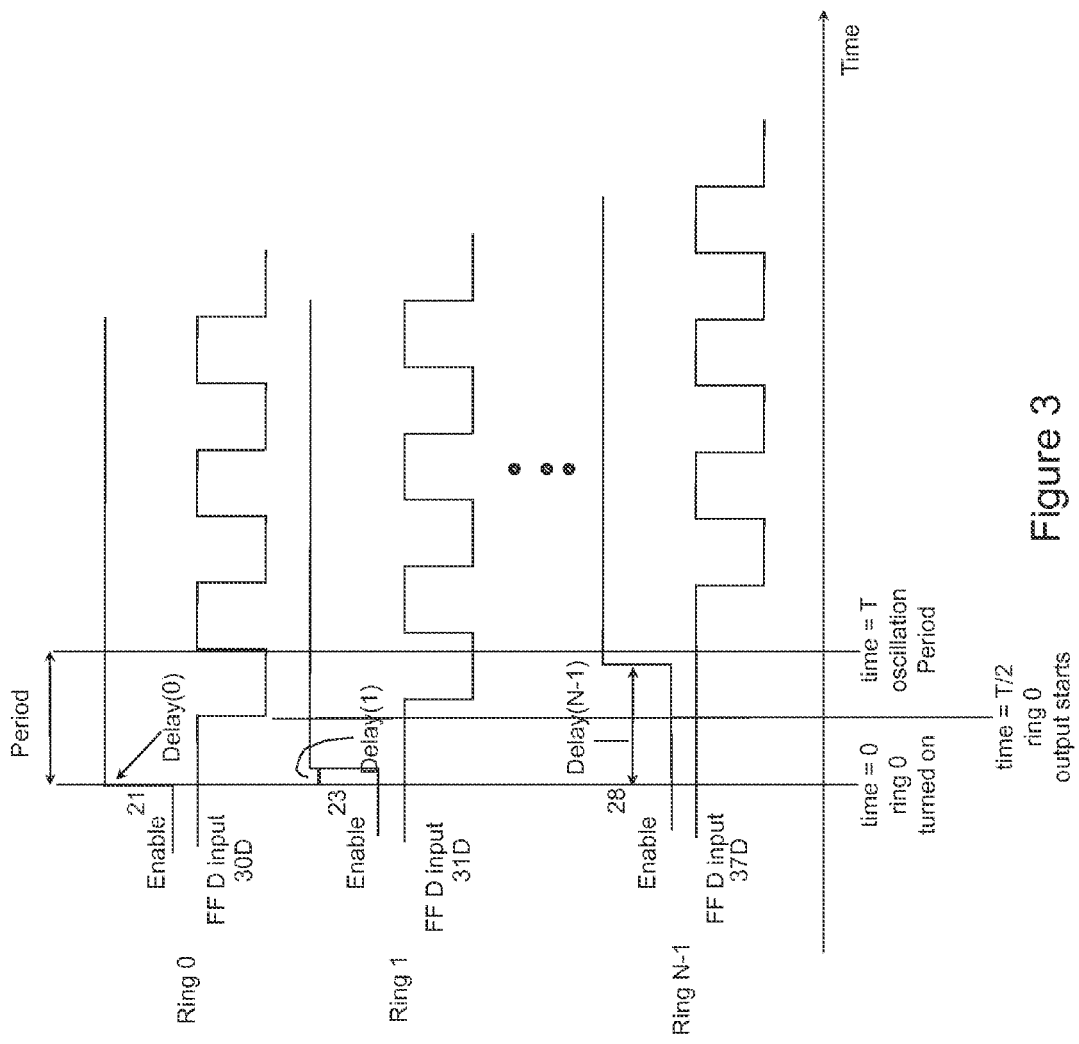
FIG. 3 is a timing diagram of the delayed enable signals and the oscillator outputs.

Referring to FIG. 3, the time delays on the enable signals, 21, 23, through 28, of each successive ring oscillator are shown delayed over one oscillation time period of the rings. Below each of the enable signals 21, 23 through 28, the inputs to flip-flops 30, 31 through 37, are shown as 30D, 31D through 37D.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A random number generator comprising:
a plurality of ring oscillator chains each having an input and an output and each comprising a same oscillation period;
a plurality of latches each corresponding to one of said ring oscillator chains and having an input and an output for latching said outputs of said ring oscillator chains;
a first plurality of exclusive OR gates having two inputs and one output, wherein said inputs being connected to every two latch outputs;
a second plurality of exclusive OR gates, the inputs of which are connected to the outputs of every two immediately preceding exclusive OR gates; and
a plurality of delay cells each corresponding to one of said ring oscillator chains and having an input and an output and having different delay durations, the inputs of which are connected to an enable signal,
wherein said input of each of said ring oscillator chains is connected to said output of a corresponding delay cell so as to provide incrementally staggered startup delays in said enable signal inputs into each said ring oscillator,
wherein said incrementally staggered startup delays are uniformly spread across said oscillation period.

2. The apparatus of claim 1, wherein said plurality of delay cells induce relatively different time delays in said enable signal to each of said plurality of ring oscillator chains.

3. A random number generator based on ring oscillators that include intentionally staggered startup delays, comprising
- a plurality of ring oscillator chains each having an enable input and an output and each comprising a same oscillation period;
- time delay cells connected prior to said enable inputs, each corresponding to one of said ring oscillator chains,
  - wherein said time delay cells incrementally stagger said startup delays in said enable inputs uniformly across said oscillation period;
- a plurality of latches each having an input and an output, each of said latches corresponding to one of said ring oscillator chains,
  - wherein said output of each said ring oscillator chains is connected to said input of said corresponding latch;
- a first plurality of exclusive OR gates each having a first input, a second input, and an output, each of said exclusive OR gates corresponding to a pair of said latches,
  - wherein an output of each first latch of said pair of latches is connected to said first input of said corresponding exclusive OR gate, and
  - wherein an output of each second latch of said pair of latches is connected to said second input of said corresponding exclusive OR gate; and
- at least one second exclusive OR gate having a first input, a second input, and an output, said first input and said second inputs being connected to said outputs of said first plurality of exclusive OR gates.

4. The apparatus of claim 3, wherein each of said time delay cells have uniquely different time delay values so as to delay said enable signal to each said ring oscillator chain by uniquely different amounts of time.

5. A method for generating random numbers, comprising the steps of:
- latching each output of a column of N ring oscillators, each ring oscillator comprising a same oscillation period;
- exclusive OR'ing each said latched output into a column of N/2 exclusive OR gates;
- exclusive OR'ing the outputs of previous columns of exclusive OR gates into successive columns of exclusive OR gates until said successive column contains only one exclusive OR gate;
- creating incrementally staggered time delay paths via a plurality of time delay cells, each time delay cell connected prior to a corresponding enable signal input of each of said N ring oscillators;
- applying an enable signal to said staggered time delay paths,
  - wherein said time delay paths incrementally stagger startup delays in said enable signal at said enable signal inputs uniformly across said oscillation period.

6. The method of claim 5, wherein said staggered time delay paths are staggered in time relative to each other staggered time delay path.

\* \* \* \* \*